United States Patent
Tien et al.

(10) Patent No.: US 10,879,455 B2
(45) Date of Patent: Dec. 29, 2020

(54) METHODS OF FABRICATING MAGNETO-RESISTIVE RANDOM-ACCESS MEMORY (MRAM) DEVICES TO AVOID DAMAGING MAGNETIC TUNNEL JUNCTION (MTJ) STRUCTURE

(71) Applicant: Taiwan Semiconductor Manufacturing Co., Ltd., Hsinchu (TW)

(72) Inventors: Hsi-Wen Tien, Xinfeng Township, Hsinchu County (TW); Wei-Hao Liao, Taichung (TW); Pin-Ren Dai, New Taipei (TW); Chih-Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/123,034

(22) Filed: Sep. 6, 2018

(65) Prior Publication Data

US 2020/0020849 A1     Jan. 16, 2020

Related U.S. Application Data

(60) Provisional application No. 62/697,575, filed on Jul. 13, 2018.

(51) Int. Cl.
| | | |
|---|---|---|
| *H01L 43/08* | (2006.01) | |
| *H01L 27/22* | (2006.01) | |
| *H01L 43/02* | (2006.01) | |
| *H01L 43/12* | (2006.01) | |
| *G11C 11/16* | (2006.01) | |
| *H01L 43/10* | (2006.01) | |
| *H01L 21/768* | (2006.01) | |

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01); *H01L 43/12* (2013.01); *H01L 21/76832* (2013.01)

(58) Field of Classification Search
CPC ... H01L 43/12; H01L 43/02; H01L 21/76885; G11C 11/161; G11C 11/04
See application file for complete search history.

(56) References Cited

U.S. PATENT DOCUMENTS

| | | | | |
|---|---|---|---|---|
| 7,122,386 B1* | 10/2006 | Torng | ...................... | H01L 43/12 438/3 |
| 2013/0119494 A1* | 5/2013 | Li | ........................... | H01L 43/08 257/421 |

(Continued)

*Primary Examiner* — Wael M Fahmy
*Assistant Examiner* — Sarah K Salerno
(74) *Attorney, Agent, or Firm* — McClure, Qualey & Rodack, LLP

(57) ABSTRACT

Methods of fabricating MRAM devices are provided. The method includes forming an etch stop layer over a substrate, and depositing a bottom electrode layer on the etch stop layer. The method also includes patterning the bottom electrode layer to form a bottom electrode. The method further includes depositing a magnetic tunnel junction (MTJ) layer on the bottom electrode, and depositing a top electrode layer on the MTJ layer. In addition, the method includes patterning the top electrode layer to form a top electrode, and patterning the MTJ layer to form an MTJ structure.

20 Claims, 17 Drawing Sheets

(56) References Cited

U.S. PATENT DOCUMENTS

| | | | | |
|---|---|---|---|---|
| 2014/0349413 A1* | 11/2014 | Chung | ................ | H01L 43/02 |
| | | | | 438/3 |
| 2016/0027843 A1* | 1/2016 | Kumura | ............... | H01L 43/08 |
| | | | | 257/295 |
| 2016/0380183 A1* | 12/2016 | Chuang | ............... | H01L 43/12 |
| | | | | 257/421 |
| 2017/0222128 A1* | 8/2017 | Sung | ............ | H01L 43/02 |
| 2017/0294576 A1* | 10/2017 | Huang | ................ | H01L 43/08 |

* cited by examiner

METHODS OF FABRICATING MAGNETO-RESISTIVE RANDOM-ACCESS MEMORY (MRAM) DEVICES TO AVOID DAMAGING MAGNETIC TUNNEL JUNCTION (MTJ) STRUCTURE

PRIORITY CLAIM AND CROSS-REFERENCE

This application claims the benefit of U.S. Provisional Application No. 62/697,575, filed on Jul. 13, 2018, the entirety of which is incorporated by reference herein.

BACKGROUND

Semiconductor memory devices are used in integrated circuits (ICs) to store digital data for electronic applications. One type of semiconductor memory device is the spin electronic device, which combines semiconductor technology with magnetic materials and devices. The spin, rather than the charge, of electrons is used to indicate a bit through their magnetic moments.

One such spin electronic device is the magneto-resistive random-access memory (MRAM) device. MRAM devices include word-lines and bit-lines which are perpendicular to one another in different metal layers. The word-lines and the bit-lines sandwich MRAM cells. An MRAM cell includes a magnetic tunnel junction (MTJ) structure having a variable resistance, which is located between two electrodes. The MTJ structure changes its resistive state based on the directions of magnetic moments of two magnetic layers thereof.

MRAM is typically faster and has better endurance than current non-volatile memory, such as flash random access memory. Moreover, MRAM typically has similar performance and lower power consumption than current volatile memory, such as dynamic random access memory (DRAM) and static random access memory (SRAM). MRAM is one promising candidate for next-generation non-volatile memory technology. However, as the semiconductor integrated circuit (IC) industry has progressed into nanometer technology process nodes, new challenges are arising in the fabrication of MRAM devices with MTJ structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
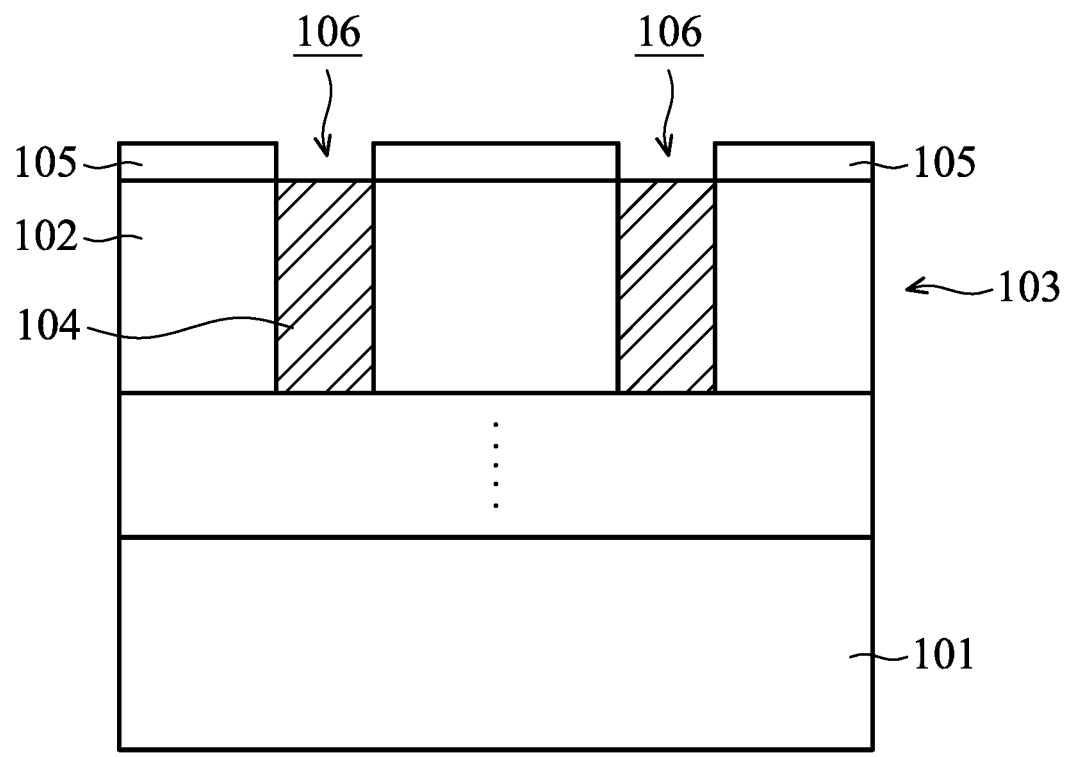
FIGS. 1-14 illustrate cross-sectional views of intermediate structures at various stages of fabricating a magneto-resistive random-access memory (MRAM) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) devices have multiple MRAM cells arranged in array. MRAM cells are configured to store data using magnetic storage elements. Typically, MRAM cells include a magnetic tunnel junction (MTJ) structure disposed between a lower electrode and an upper electrode and vertically arranged with a back-end-of-the-line (BEOL) metal stack. The MTJ structure includes a pinned magnetic layer and a free magnetic layer, which are vertically separated by an insulating barrier layer. The magnetic orientation of the pinned magnetic layer is static (i.e., fixed), while the magnetic orientation of the free magnetic layer is capable of switching between a parallel configuration with respect to that of the pinned magnetic layer and an anti-parallel configuration. The parallel configuration provides for a low resistance state that digitally stores data as a first bit value (e.g., a logical "0"). The anti-parallel configuration provides for a high-resistance state that digitally stores data as a second bit value (e.g., a logical "1").

As the functionality of integrated circuits increases, the need for more memory also increases, causing integrated circuits in design and manufacture to increase the amount of available memory while decreasing the size and power consumption of memory. To reach this goal, the size of memory cell components has been aggressively shrunk over the past few decades. In MRAM memory cells, as the size of memory cell components decreases, the ability to align an MTJ structure with the lower electrode becomes increasingly difficult since the overlay tolerance between the MTJ structure and the lower electrode will decrease. It has been appreciated that overlay shift can cause an etching mask of the lower electrode to be offset from the MTJ structure, resulting in a recess punch through the MTJ structure (e.g., the recess extending along a side of the MTJ structure to an underlying layer) and damaging the MTJ structure.

Embodiments disclosed herein relate generally to fabricating magneto-resistive random-access memory (MRAM) devices to avoid damaging an MTJ structure and to structures formed thereby. In some embodiments, a bottom electrode layer is etched first to form a plurality of bottom electrodes (or referred to as bottom electrode vias), and then an MTJ layer is etched to form a plurality of MTJ structures. Each MRAM cell includes one bottom electrode and one MTJ structure disposed over the bottom electrode. According to embodiments of the disclosure, after the MTJ structure is formed, there is no need to pattern a bottom electrode layer under the MTJ structure using lithography and etching processes. The formed MTJ structure in embodiments of the disclosure is not damaged by an etching process for forming the bottom electrode. Therefore, the methods of fabricating magneto-resistive random-access memory (MRAM) devices of the disclosure using a novel bottom electrode etching approach can avoid damaging the MTJ structure of MRAM devices. The electrical characteristics and performances of the MRAM devices are thereby improved.

The foregoing broadly outlines some aspects of the embodiments described herein. Some embodiments described herein are described in the context of MRAM devices, and more particularly, in the context of forming a bottom electrode to avoid damaging an MTJ structure of a MRAM cell. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein. It should be understood that additional blocks can be provided before, during, and after the method, and some of the blocks described can be replaced, exchanged or eliminated for other embodiments of the method.

Embodiments for fabricating MRAM devices are provided. FIGS. 1 to 14 illustrate cross-sectional views of intermediate structures at various stages of fabricating a magneto-resistive random-access memory (MRAM) device 100, in accordance with some embodiments. A substrate 101 is provided, as shown in FIG. 1 in accordance with some embodiments. The substrate 101 may be a bulk semiconductor substrate or a semiconductor-on-insulator (SOI) substrate, which may be doped (e.g., with a p-type or an n-type dopant) or undoped. Generally, an SOI substrate includes a layer of a semiconductor material formed on an insulator layer. The insulator layer may be a buried oxide (BOX) layer or a silicon oxide layer. The insulator layer may be provided on a silicon or glass substrate. The substrate 101 may be made of silicon or another semiconductor material. For example, the substrate 101 is a silicon wafer. In some examples, the substrate 101 is made of a compound semiconductor such as silicon carbide, gallium arsenic, indium arsenide, or indium phosphide. In some examples, the substrate 101 is made of an alloy semiconductor such as GaAsP, AlInAs, AlGaAs, GaInAs, GaInP, or GaInAsP.

In some embodiments, the substrate 101 includes various p-type doped regions and/or n-type doped regions, such as p-type wells, n-type wells, p-type source/drain features and/or n-type source/drain features, formed by a process such as ion implantation and/or diffusion. The substrate 101 may include other functional elements such as resistors, capacitors, diodes, and transistors. The transistors are, for example field effect transistors (FETs), such as planar FETs and/or Fin field effect transistors (FinFETs). The substrate 101 may include lateral isolation features configured to separate various functional elements formed on and/or in the substrate 101.

A lower interconnect structure 103 is formed on the substrate 101, as shown in FIG. 1 in accordance with some embodiments. The lower interconnect structure 103 includes multiple intermetal dielectric (IMD) layers 102, multiple metal lines 104, multiple conductive vias (not shown) and multiple contacts (not shown), although FIG. 1 shows the upmost IMD layer 102 and the upmost metal lines 104 of the lower interconnect structure 103. The metal lines 104 of the same metal layer are disposed in the same IMD layer 102 to provide a horizontal electrical connection for various elements of integrated circuits (ICs). The conductive vias in the same IMD layer 102 are disposed between two adjacent metal layers to provide a vertical electrical connection. The contacts disposed in the lower interconnect structure 103 may be electrically coupled to various elements formed on the substrate 101.

The IMD layer 102 shown in FIG. 1 is the upmost dielectric layer of the lower-interconnect structure 103 which is disposed under a subsequently formed bottom electrode 108. The IMD layer 102 may be made of silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG), Spin-On-Glass (SOG), or a combination thereof. The IMD layer 102 may be deposited by spin-on coating, chemical vapor deposition (CVD), flowable CVD (FCVD), plasma enhanced CVD (PECVD), physical vapor deposition (PVD), or another deposition process.

The material of the metal lines 104 may include aluminum (Al), copper (Cu), gold (Au), tungsten (W), other suitable metal or metal alloy materials, or a combination thereof. The metal lines 104 may be formed by depositing a metal layer using atomic layer deposition (ALD), PECVD, PVD, or another deposition process in openings of the IMD layer 102 and on the IMD layer 102. Any excess portion of the metal layer over the IMD layer 102 is then removed to form the metal lines 104 in the IMD layer 102. The excess portion of the metal layer may be removed by a planarization process, such as a chemical mechanical polishing (CMP) process.

An etch stop layer (ESL) 105 is formed on the lower interconnect structure 103, as shown in FIG. 1 in accordance with some embodiments. The etch stop layer 105 has openings 106 to expose the metal lines 104 of the lower-interconnect structure 103. In some embodiments, the etch stop layer 105 is formed using a selective deposition process on the IMD layer 102 of the lower-interconnect structure 103 to have the openings 106. In some other embodiments, the openings 106 of the etch stop layer 105 are formed using photolithography and etching processes. A patterned photoresist (not shown) may be formed on a blanketly deposited material layer of the etch stop layer 105 using photolithography process. The patterned photoresist has openings corresponding to the locations of the metal lines 104. Then, the blanketly deposited material layer of the etch stop layer 105 is etched using the patterned photoresist as an etching mask to form the openings 106. The material of the etch stop layer 105 includes a metal oxide or a dielectric material. The metal oxide is for example aluminum oxide (AlOx), titanium oxide (TiO), aluminum oxynitride (AlON) or zirconium oxide (ZrO), which may be deposited at a temperature in a range from about 150° C. to about 400° C. by CVD, PVD, sputtering or other suitable process. The dielectric material is for example silicon carbide (SiC), silicon oxide ($SiO_2$), silicon oxycarbide (SiOC), silicon nitride (SiN), silicon carbon nitride (SiCN), silicon oxynitride (SiON), silicon oxycarbon nitride (SiOCN) or other similar materials, which may be deposited at a temperature in a range from about 180° C. to about 400° C. by CVD, PVD, sputtering or other suitable process. In some examples, the etch stop layer 105 has a thickness in a range from about 30 Å to about 200 Å.

Figure 2:
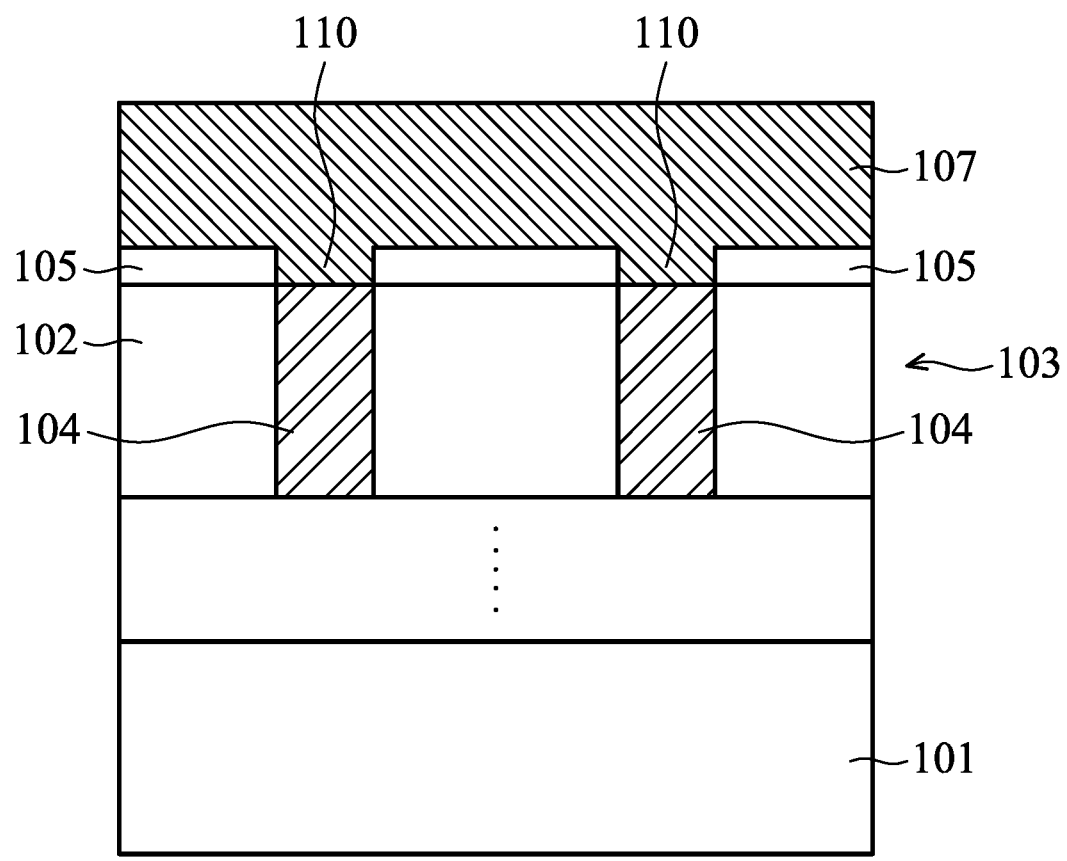

A bottom electrode layer 107 is deposited on the etch stop layer 105, as shown in FIG. 2 in accordance with some embodiments. Furthermore, the openings 106 of the etch stop layer 105 are filled with the bottom electrode layer 107 to form vias 110 in the etch stop layer 105. The vias 110 are in contact with and are electrically connected to the metal lines 104 of the lower-interconnect structure 103. The bottom electrode layer 107 is made of conductive materials such as metal, metal alloy, metal nitride or a combination thereof. The material of the bottom electrode layer 107 is for example tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu) or other suitable conductive material(s) or layered combination thereof. The bottom electrode layer 107 may be deposited at a temperature in a range from about 150° C. to about 400° C. by PVD, CVD, ALD, spin-on coating or other suitable deposition process. In some examples, the bottom electrode layer 107 has a thickness in a range from about 10 Å to about 1000 Å.

Figure 3:
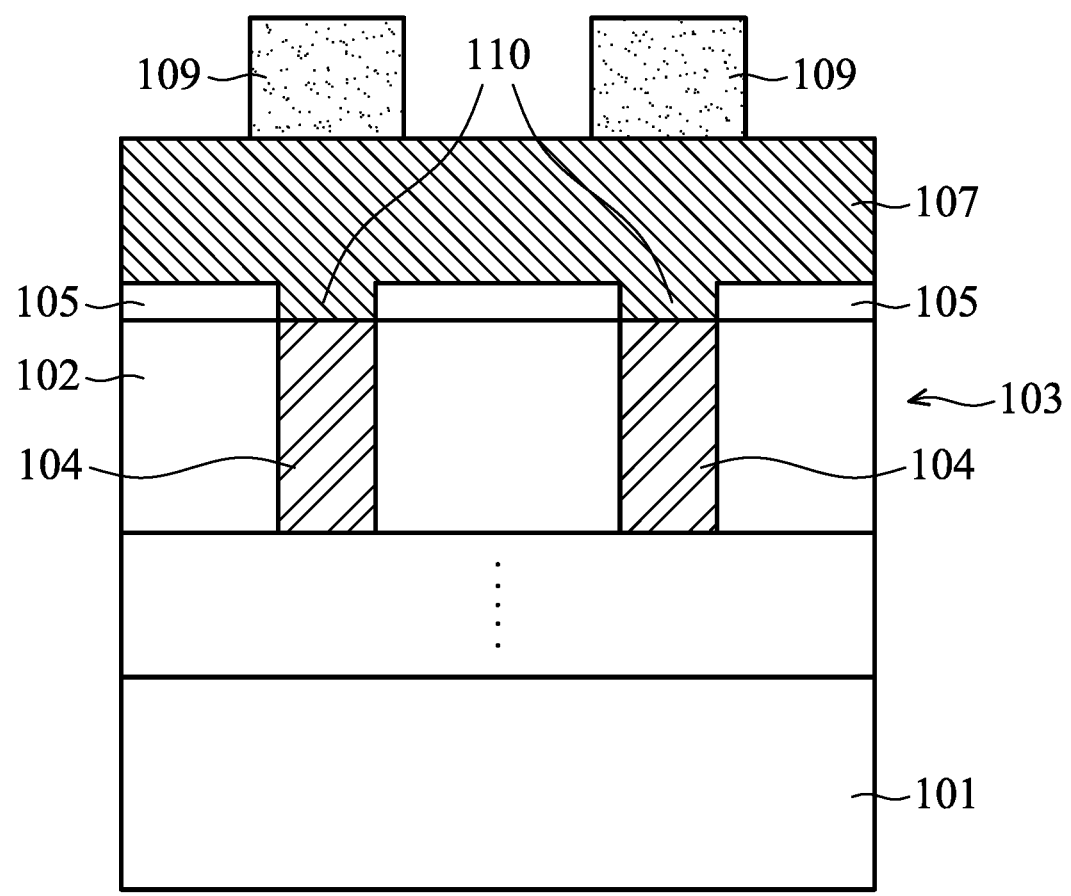

According to embodiments of the disclosure, the bottom electrode layer 107 is patterned to form a plurality of bottom electrodes (or referred to as bottom electrode vias) before forming an MTJ structure. A mask 109 is formed on the bottom electrode layer 107, as shown in FIG. 3 in accordance with some embodiments. In some embodiments, the mask 109 is a patterned photoresist layer formed by a lithography process. The lithography process may include coating, exposure and developing a photoresist layer. The photoresist layer is coated on the bottom electrode layer 107 by a suitable process, such as spin-on coating. The photoresist layer is then exposed to a light source through a photomask. The exposed photoresist layer is then developed to form the patterned photoresist layer. The lithography process may further include one or more baking process, such as soft baking, post exposure baking and hard baking. The lithography process may alternatively include other technique, such as electron-beam direct writing, or maskless lithography.

In some other embodiments, the mask 109 is a hard mask. In this case, a hard mask layer is deposited between the bottom electrode layer 107 and a photoresist layer. The photoresist layer is patterned by the lithography process mentioned as the foregoing, and an etching process is applied to the hard mask layer to transfer the pattern from the patterned photoresist layer to the hard mask layer to form the hard mask.

Figure 4:
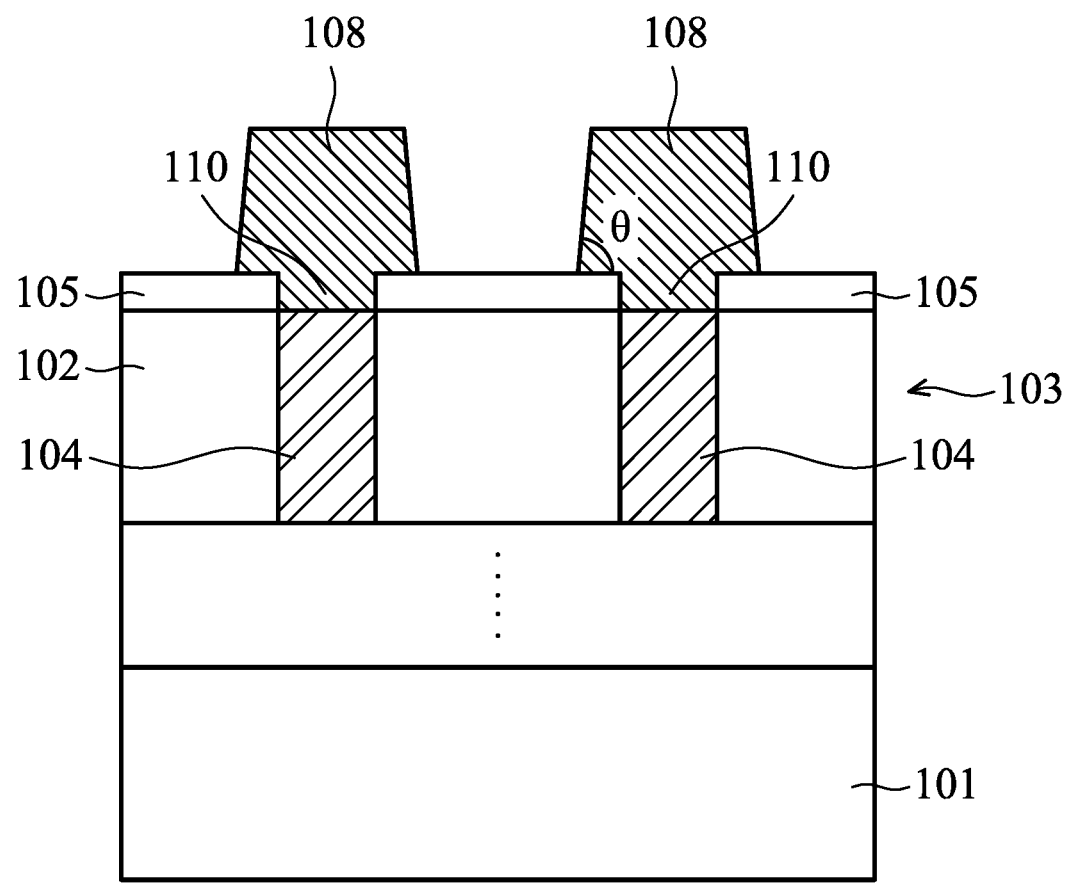

Next, the bottom electrode layer 107 is patterned by an etching process using the mask 109 of FIG. 3 as an etch mask to form a plurality of bottom electrodes (or referred to as bottom electrode vias) 108, as shown in FIG. 4 in accordance with some embodiments. The etching process may include an ion beam etch (IBE) or a reactive ion etch (RIE) process. In some embodiments, the RIE process may be inductively coupled plasma (ICP) or capacitively coupled plasma (CCP) type RIE process. The ICP or CCP type RIE process may use an etchant gas such as CH$_4$, a CHF species (including CH$_3$F, CH$_2$F$_2$, or CHF$_3$), a CF species (including C$_4$F$_8$, C$_4$F$_6$, or CF$_4$), H$_2$, HBr, CO, CO$_2$, O$_2$, BCl$_3$, Cl$_2$, N$_2$, He, Ne, Ar or a combination thereof. In some examples, the RIE process is performed at a pressure in a range from about 0.5 mtorr to about 120 mtorr and at a temperature in a range from about 10° C. to about 100° C. In addition, the RIE process is performed with a power in a range from about 50 W to about 3000 W, and a bias in a range from about 0V to about 1200V.

In some embodiments, the bottom electrode layer 107 is etched by an IBE process. The IBE process may use an etchant gas such as He, Ne, Ar, Kr, Xe or a combination thereof. In some examples, the IBE process may be performed with an angle of incidence of the ions in a range from about 0 degree to about 70 degrees. In addition, the IBE process is performed with a power in a range from about 50 W to about 3000 W.

As a result, each of the bottom electrodes 108 is formed to have a bottom width that is substantially the same as or greater than a top width thereof. In some examples, the bottom width of the bottom electrode 108 is in a range from about 15 nm to about 300 nm. Also, the top width of the bottom electrode 108 is in a range from about 15 nm to about 300 nm. The angle θ between the sidewall and the bottom surface of the bottom electrode 108 is in a range from about 50 degrees to about 90 degrees. The bottom electrode 108 may have a trapezoidal profile or a rectangular profile in a cross section.

Figure 5:
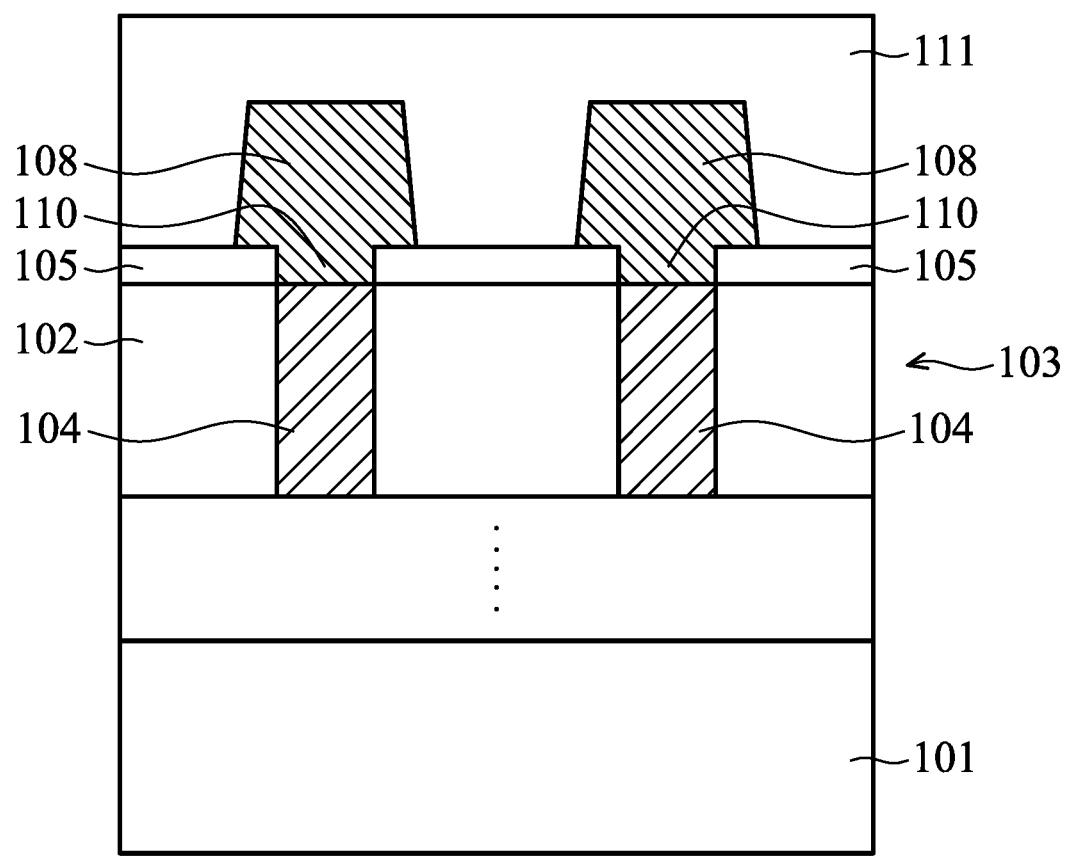

Next, a dielectric layer 111 is deposited over the etch stop layer 105 to cover the bottom electrodes 108 and to fill the space between the neighboring bottom electrodes 108, as shown in FIG. 5 in accordance with some embodiments. The material of the dielectric layer 111 may include SiCN, SiN, SiO$_2$, SiC, SiOC, a low dielectric constant (k) dielectric material, another suitable dielectric material, or a combination thereof. The dielectric layer 111 may be deposited at a temperature in a range from about 80° C. to about 400° C. by CVD, ALD, spin-on coating or other suitable deposition process. In some examples, the dielectric layer 111 has a thickness in a range from about 600 Å to about 2000 Å.

Figure 6:
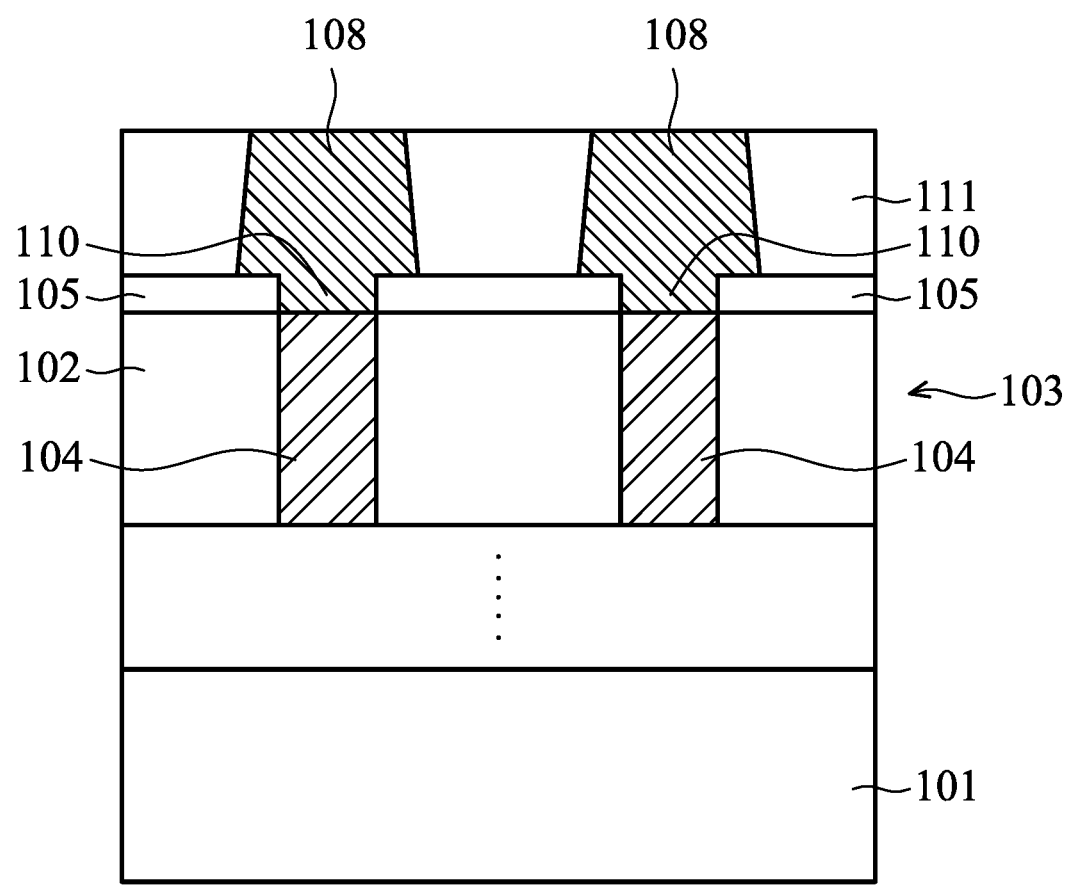

Next, a portion of the dielectric layer 111 is removed to expose the top surface of the bottom electrodes 108, as shown in FIG. 6 in accordance with some embodiments. The portion of the dielectric layer 111 may be removed by an etch-back process or a planarization process, such as a CMP process. After that, the top surfaces of the bottom electrodes 108 are level with the top surface of the dielectric layer 111.

Figure 7:
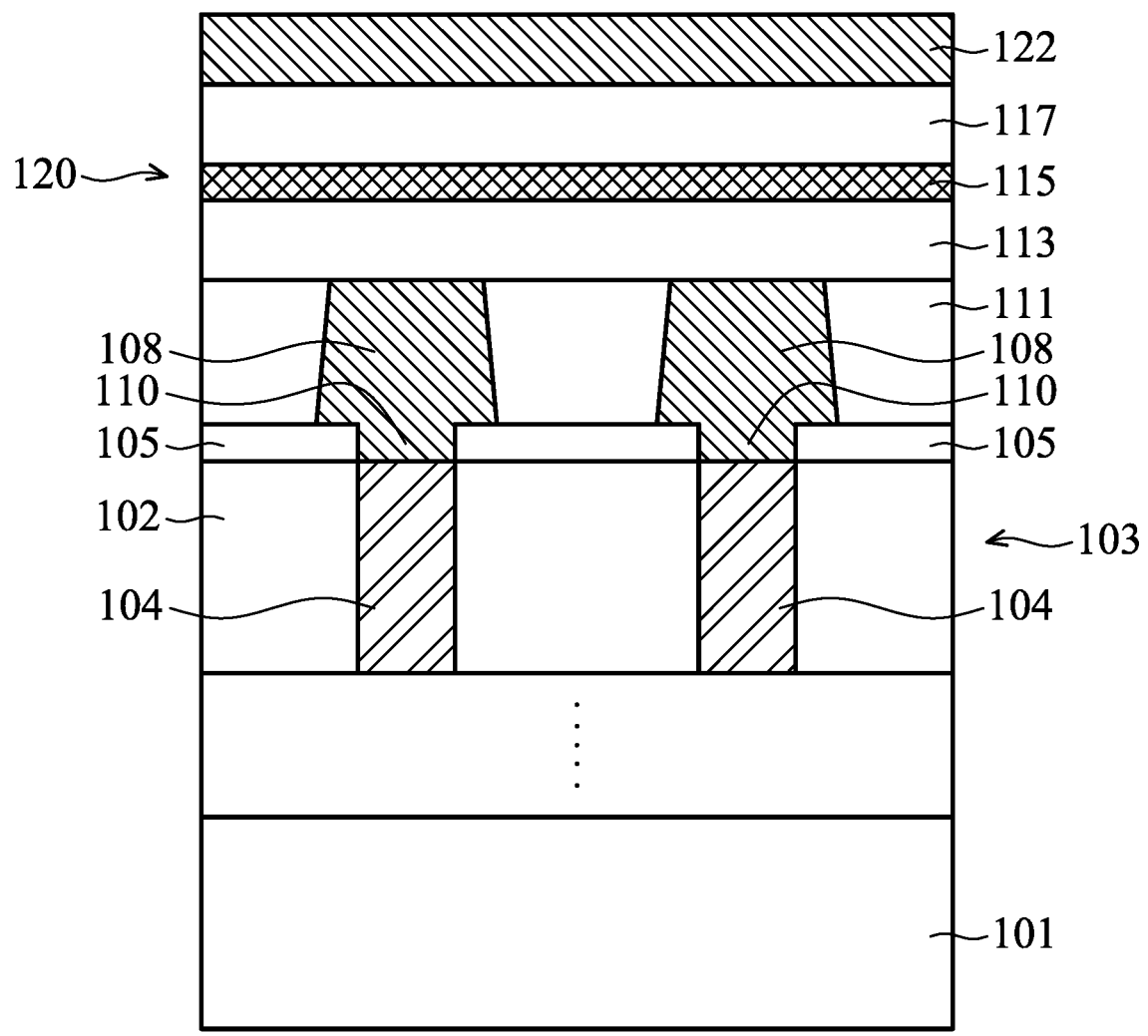

An MTJ layer 120 is then deposited on the planar top surfaces of the bottom electrodes 108 and the dielectric layer 111, as shown in FIG. 7 in accordance with some embodiments. The MTJ layer 120 includes a first ferromagnetic layer 113 arranged over the bottom electrodes 108 and the dielectric layer 111, an insulating barrier layer 115 arranged over the first ferromagnetic layer 113, and a second ferromagnetic layer 117 arranged over the insulating barrier layer 115. In some embodiments, the first ferromagnetic layer 113 is a pinned layer, and the second ferromagnetic layer 117 is a free layer. In this case, an anti-ferromagnetic (AFM) layer (not shown) is arranged under the first ferromagnetic layer 113 and above the bottom electrodes 108 and the dielectric layer 111.

In some other embodiments, the first ferromagnetic layer 113 is a free layer, and the second ferromagnetic layer 117 is a pinned layer. In this case, an AFM layer (not shown) is arranged under the second ferromagnetic layer 117 and above the insulating barrier layer 115.

The AFM layer may be made of platinum manganese (PtMn), iridium manganese (IrMn), rhodium manganese (RhMn) or iron manganese (FeMn). The ferromagnetic layer arranged on the AFM layer can be used as a pinned layer due to the magnetic moment of the pinned layer is pinned in a particular direction by the AFM layer. The AFM layer may be deposited using various deposition processes such as CVD, PVD, or ALD process. The AFM layer may have a thickness in a range from about 80 Å to about 200 Å.

The pinned layer does not change its magnetic moment during operation of the MRAM cells with the MTJ structure. The pinned layer such as the first ferromagnetic layer 113 or the second ferromagnetic layer 117 may be made of CoFeB, CoFeTa, NiFe, Co, CoFe, CoPt, CoPd, FePt, Ru, or other alloys of Ni, Co and Fe. The pinned layer may be deposited using various deposition processes such as CVD, PVD, or ALD process. In some examples, the pinned layer may have a thickness in a range from about 30 Å to about 100 Å.

Unlike the pinned layer, the magnetic moment direction of the free layer can change under various conditions during operation of the MRAM cells with the MTJ structure because there is no AFM layer adjacent to the free layer. The free layer such as the first ferromagnetic layer 113 or the second ferromagnetic layer 117 is also made of a ferromagnetic material, for example CoFeB, CoFeTa, NiFe, Co, CoFe, CoPt, CoPd, FePt, Ru, or other alloys of Ni, Co and Fe. The free layer may be deposited using various deposition processes such as CVD, PVD, or ALD process. In some examples, the free layer may have a thickness in a range from about 10 Å to about 30 Å.

The insulating barrier layer 115 may be made of dielectric material, such as magnesium oxide (MgO), aluminum oxide (AlOx or $Al_2O_3$), aluminum nitride (AlN), aluminum oxynitride (AlON), other suitable materials, or a combination thereof. The insulating barrier layer 115 may be deposited using various deposition processes such as CVD, PVD, or ALD process. In some examples, the insulating barrier layer 115 may have a thickness in a range from about 1 Å to about 50 Å.

A top electrode layer 122 is then deposited onto the MTJ layer 120, as shown in FIG. 7 in accordance with some embodiments. The top electrode layer 122 may be made of a conductive material, such as tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu) or other suitable conductive material(s) or layered combination thereof. The top electrode layer 122 may be deposited at a temperature in a range from about 150° C. to about 400° C. by PVD, CVD, ALD, spin-on coating or other suitable deposition process. In some examples, the top electrode layer 122 has a thickness in a range from about 100 Å to about 600 Å.

Figure 8:
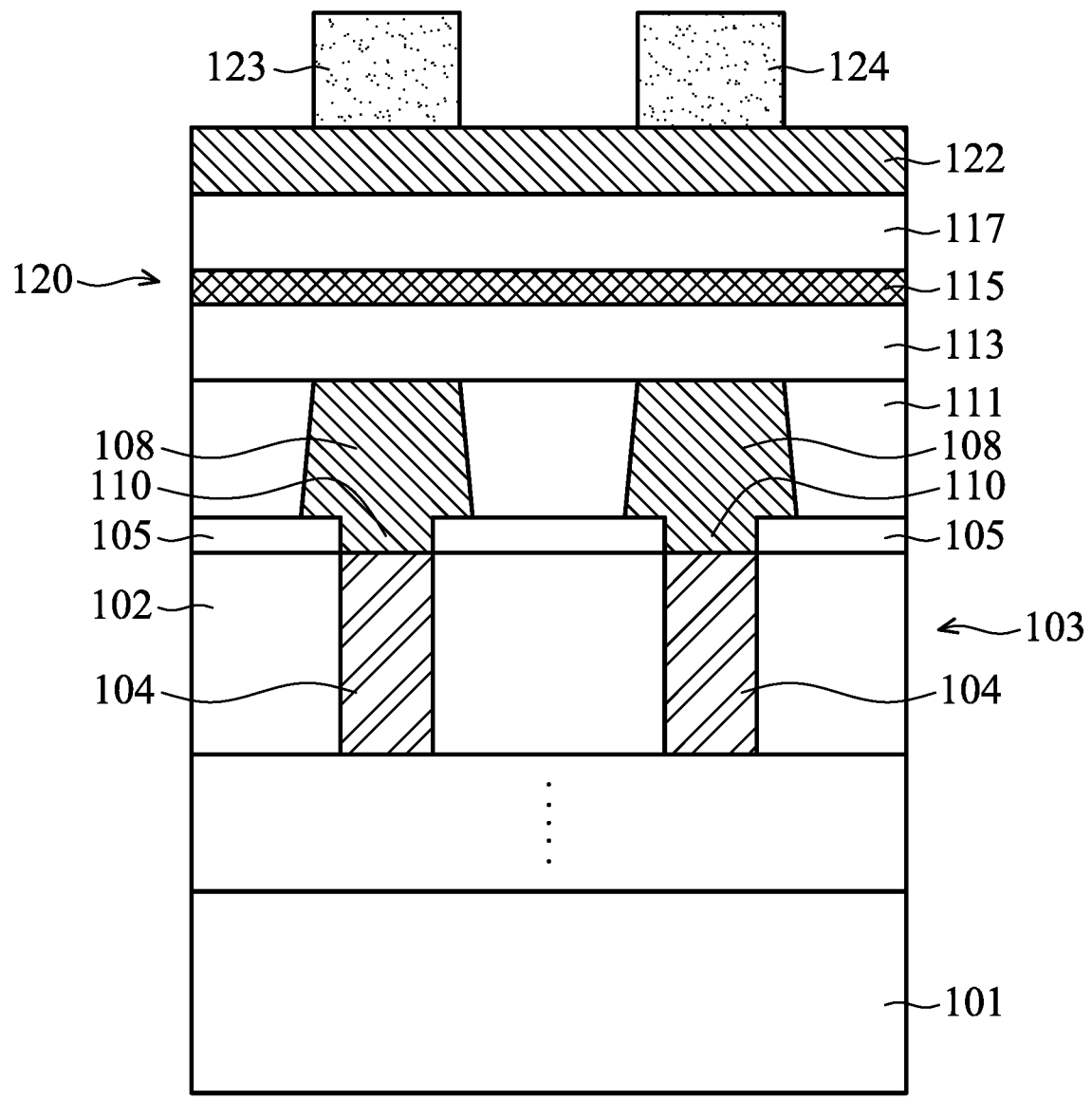

Next, a mask 124 is formed on the top electrode layer 122, as shown in FIG. 8 in accordance with some embodiments. In some embodiments, the mask 124 is a patterned photoresist layer formed by a lithography process. The lithography process may include coating, exposure and developing a photoresist layer. The photoresist layer is coated on the top electrode layer 122 by a suitable process, such as spin-on coating. The photoresist layer is then exposed to a light source through a photomask. The exposed photoresist layer is then developed to form the patterned photoresist layer. The lithography process may further include one or more baking process, such as soft baking, post exposure baking and hard baking. The lithography process may alternatively include other technique, such as electron-beam direct writing, or mask-less lithography.

In some other embodiments, the mask 124 is a hard mask. In this case, a hard mask layer is deposited between the top electrode layer 122 and a photoresist layer. The photoresist layer is patterned by the lithography process mentioned as the foregoing, and an etching process is applied to the hard mask layer to transfer the pattern from the patterned photoresist layer to the hard mask layer to form the hard mask.

Figure 9:
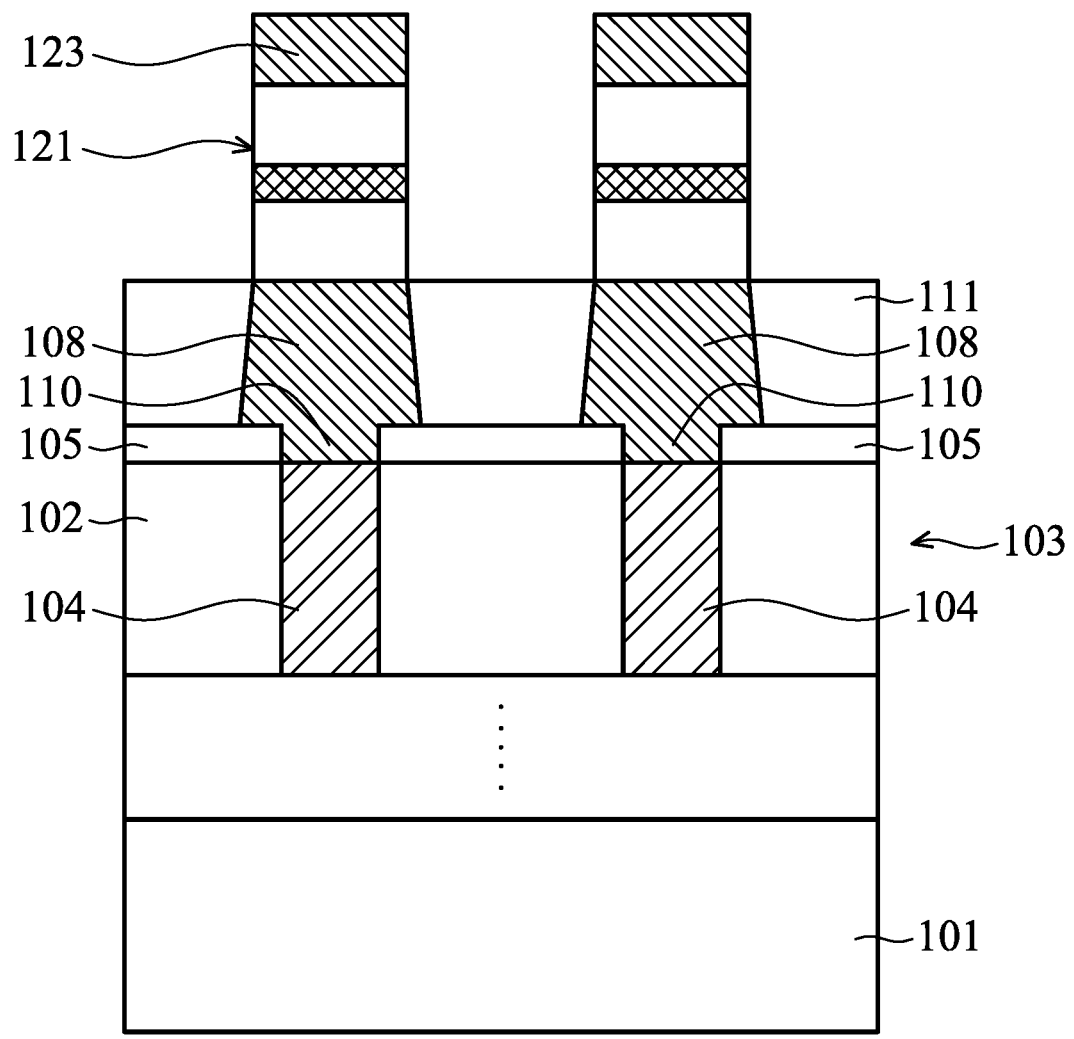

Next, the top electrode layer 122 is patterned by an etching process using the mask 124 of FIG. 8 as an etch mask to form a plurality of top electrodes 123, as shown in FIG. 9 in accordance with some embodiments. Also, the MTJ layer 120 is patterned by an etching process using the mask 124 of FIG. 8 as an etch mask to form a plurality of MTJ structures 121, as shown in FIG. 9 in accordance with some embodiments. In some embodiments, the top electrode layer 122 and the MTJ layer 120 are patterned in one step of the same etching process. In some other embodiments, the top electrode layer 122 and the MTJ layer 120 are patterned in multiple steps of different etching processes. The etching process for the MTJ layer 120 and the top electrode layer 122 may include an IBE or a RIE process. The IBE process for the MTJ layer 120 and the top electrode layer 122 may use an etchant gas such as He, Ne, Ar, Kr, Xe or a combination thereof. In some examples, the IBE process may be performed with an angle of incidence of the ions in a range from about 0 degrees to about 70 degrees. In addition, the IBE process is performed with a power in a range from about 50 W to about 3000 W. In some embodiments, the MTJ layer 120 and the top electrode layer 122 are etched using different process conditions of the IBE process.

In some embodiments, the RIE process for the MTJ layer 120 and the top electrode layer 122 may use an etchant gas such as $CH_3OH$, $C_2H_5OH$, $CH_4$, a CHF species (including $CH_3F$, $CH_2F_2$, or $CHF_3$), a CF species (including $C_4F_8$, $C_4F_6$, or $CF_4$), $H_2$, HBr, CO, $CO_2$, $O_2$, $BCl_3$, $Cl_2$, $N_2$, He, Ne, Ar or a combination thereof. In some examples, the RIE process is performed at a pressure in a range from about 0.5 mtorr to about 100 mtorr and at a temperature in a range from about 15° C. to about 120° C. In addition, the RIE process is performed with a power in a range from about 150 W to about 3000 W, and a bias in a range from about 0V to about 2000V. In some embodiments, the MTJ layer 120 and the top electrode layer 122 are etched using different process conditions of the RIE process.

As a result, in some embodiments, the width of the top electrode 123 is substantially the same as the width of the MTJ structure 121. The top electrode 123 and the MTJ structure 121 have substantially aligned sidewalls. Moreover, in some embodiments, the top width of the bottom electrode 108 may be substantially the same as the width of the MTJ structure 121. In some embodiments, the bottom electrode 108 has slanted sidewalls. The upper portion of the slanted sidewalls of the bottom electrode 108 may be substantially aligned with the sidewalls of the MTJ structure 121. In some other embodiments, the widths of the top electrode 123 and the MTJ structure 121 may be greater than the top width of the bottom electrode 108 to provide a larger landing area for a subsequently formed contact onto the top electrode 123.

When the magnetic moment of the free layer of the MTJ structure 121 is the same direction as the magnetic moment of the pinned layer of the MTJ structure 121, electrons can more readily tunnel through the insulating barrier layer 115. This causes the MTJ structure 121 to be in a relatively low resistive state. Thus, with a properly polarized voltage applied, an electric current can flow through the MTJ structure 121 between the bottom electrode 108 and the top electrode 123.

With an oppositely polarized voltage applied, the direction of the magnetic moment of the free layer of the MTJ structure 121 can be set to oppose the direction of the magnetic moment of the pinned layer of the MTJ structure 121. In this state, it is more difficult for electrons to tunnel through the insulating barrier layer 115. This causes the MTJ structure 121 to be in a high resistive state. The different resistive states may be used to represent digital values. For example, the high resistive state may be used to represent a digital "0" while the low resistive state may be used to represent a digital "1".

In order to accurately control and improve the electrical characteristics and performances of MRAM devices, it should avoid damaging the MTJ structures 121 during the fabrication of MRAM devices. According to embodiments of the disclosure, the bottom electrode 108 is formed first before forming the MTJ structures 121. Accordingly, there is no need to pattern a bottom electrode layer using lithography and etching processes to form a bottom electrode after the MTJ structure 121 is formed. Therefore, there is no overlay shift issue to damage the formed MTJ structures 121 in accordance with embodiments of the disclosure.

Figure 10:
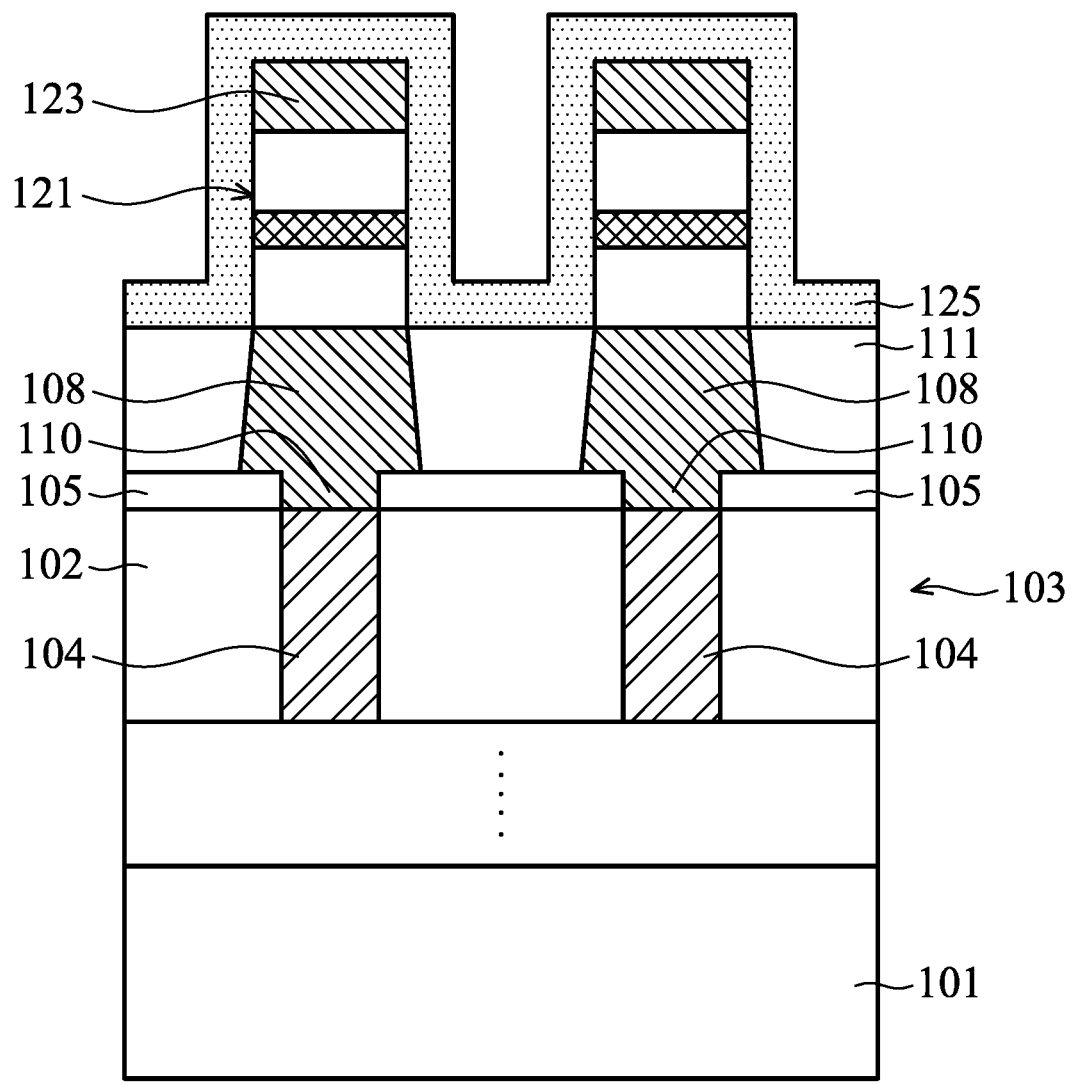

Next, a cap layer 125 is deposited on the top electrodes 123, the MTJ structures 121 and the dielectric layer 111, as shown in FIG. 10 in accordance with some embodiments. The cap layer 125 is conformally deposited on the top surface of the top electrodes 123, on the sidewalls of the top electrodes 123 and the MTJ structures 121 and on the top surface of the dielectric layer 111. The cap layer 125 may be made of dielectric materials such as SiN, SiCN, SiC, SiON, SiOC, SiOCN, $SiO_2$, or a combination thereof. The cap layer 125 may be deposited at a temperature in a range from about 80° C. to about 300° C. by PVD, CVD, ALD or other suitable deposition process. In some examples, the cap layer 125 has a thickness in a range from about 50 Å to about 300 Å.

Figure 11:
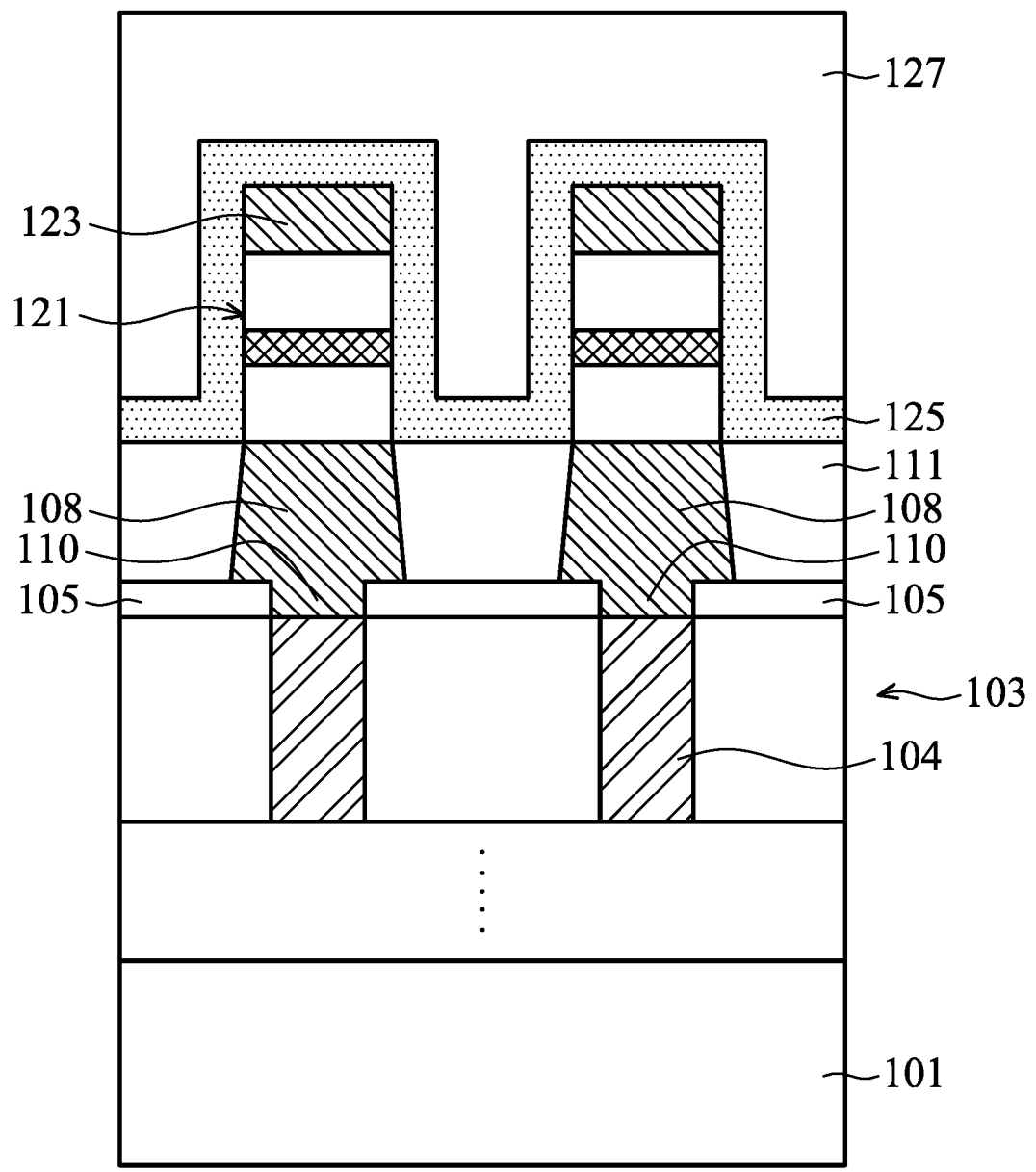

Next, a dielectric layer 127 is deposited over the cap layer 125 to cover the top electrodes 123, the MTJ structures 121 and the dielectric layer 111, and to fill the space between the neighboring pillars of the top electrodes 123 and the MTJ structures 121, as shown in FIG. 11 in accordance with some embodiments. The dielectric layer 127 fills the space between the neighboring top electrodes 123 and the space between the neighboring MTJ structures 121. The material of the dielectric layer 127 may include SiCN, SiN, $SiO_2$, SiC, SiOC, a low-k dielectric material, other suitable dielectric material, or a combination thereof. The dielectric layer 127 may be deposited at a temperature in a range from about 80° C. to about 400° C. by CVD, ALD, spin-on coating or other suitable deposition process. In some examples, the dielectric layer 127 has a thickness in a range from about 600 Å to about 2000 Å.

Figure 12:
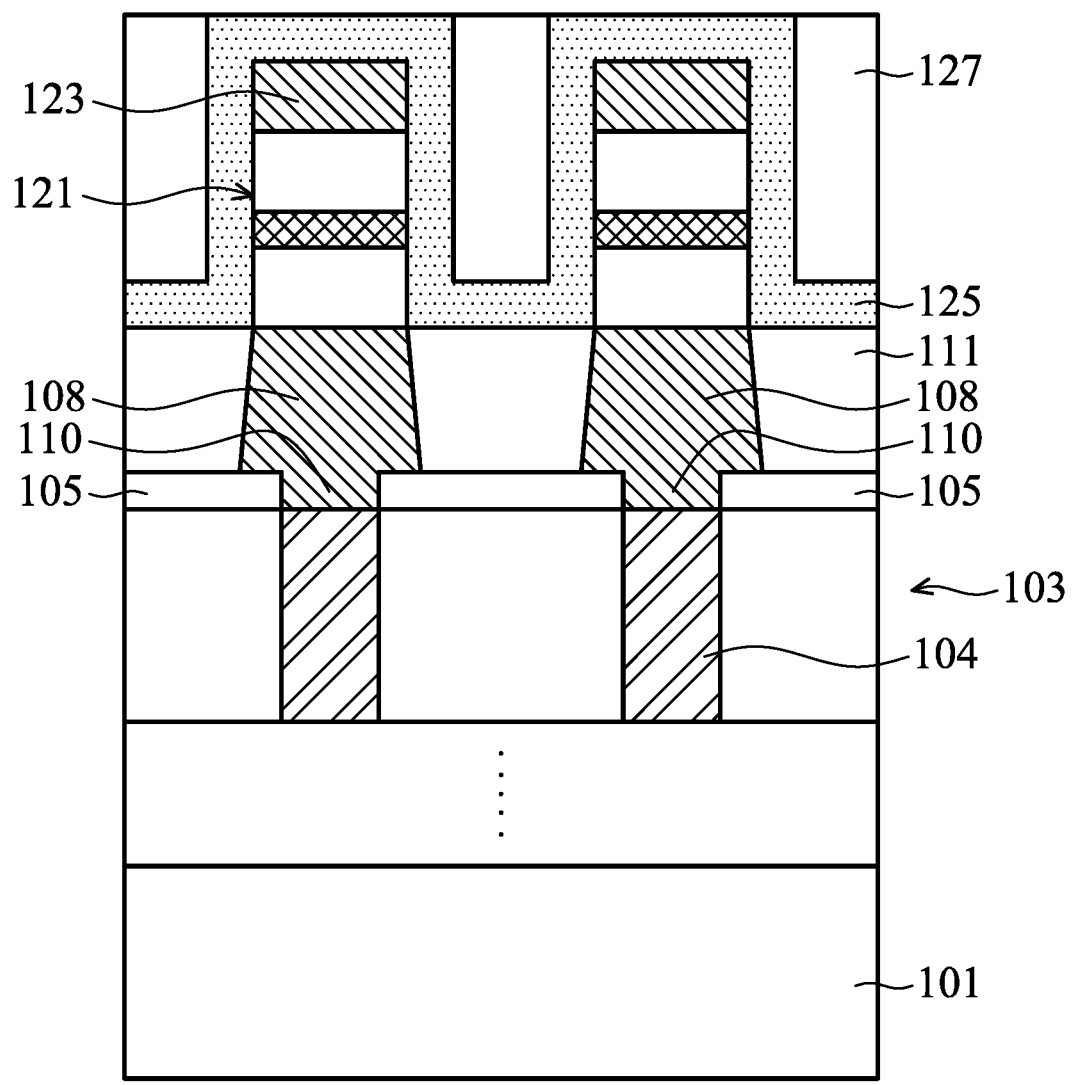

Next, a portion of the dielectric layer 127 is removed to expose the top surface of the cap layer 125, as shown in FIG. 12 in accordance with some embodiments. The portion of the dielectric layer 127 may be removed by an etch-back process or a planarization process, such as a CMP process. After that, the top surface of the cap layer 125 is level with the top surface of the dielectric layer 127.

Figure 13:
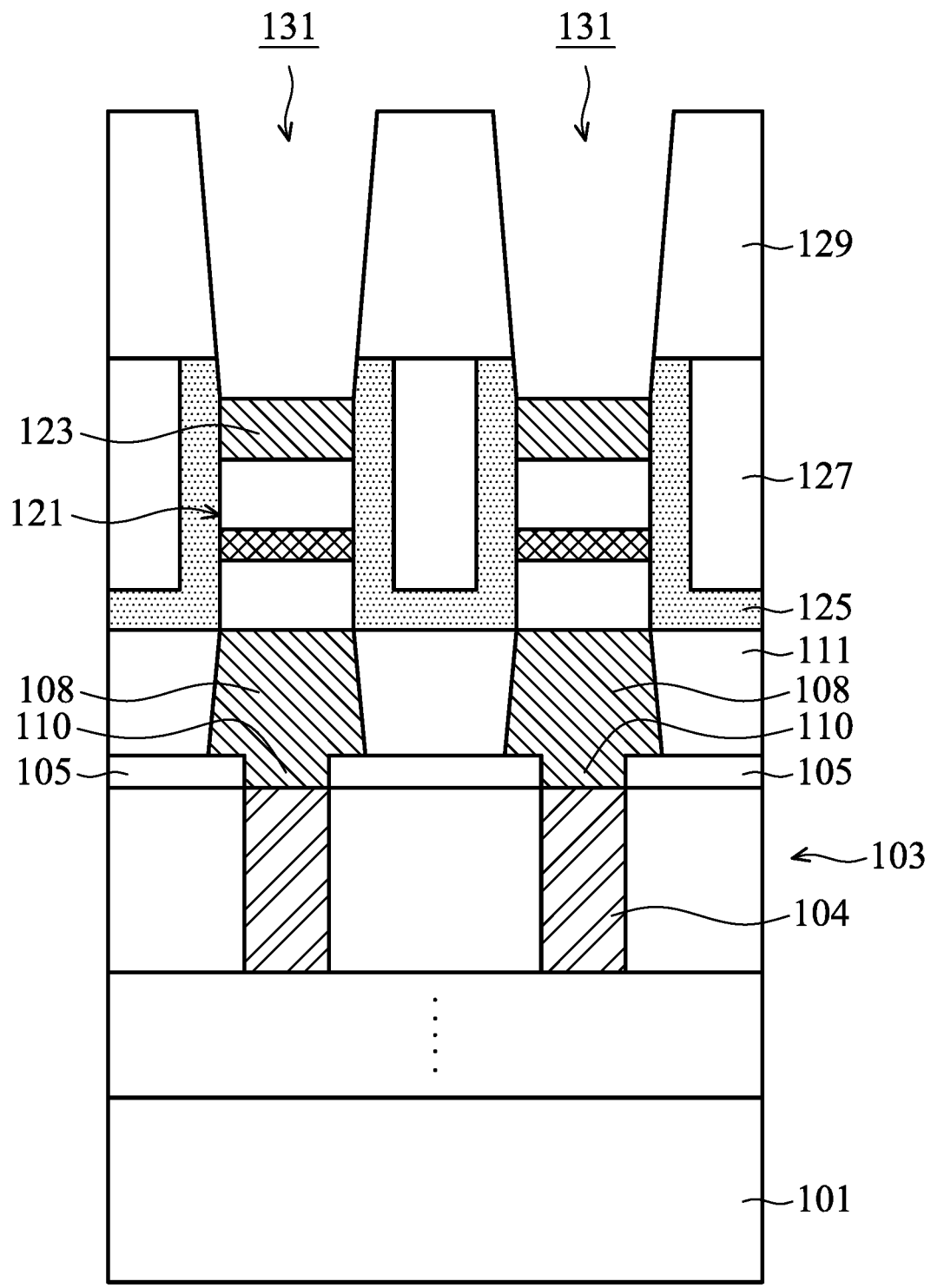

A dielectric layer 129 is deposited on the structure of FIG. 12, and then an opening 131 is formed in the dielectric layer 129 and to pass through the cap layer 125 to expose the top electrode 123, as shown in FIG. 13 in accordance with some embodiments. The dielectric layer 129 is a lowest intermetal dielectric (IMD) layer of an upper interconnect structure that is disposed above the top electrodes 123. The dielectric layer 129 may be made of silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG), spin-On-glass (SOG), or a combination thereof. The dielectric layer 129 may be deposited by spin-on coating, CVD, flowable CVD (FCVD), PECVD, PVD, or another deposition process.

The opening 131 may be formed using lithography and etching processes. A patterned photoresist layer (not shown) may be formed on the dielectric layer 129 by a lithography process. The patterned photoresist layer has an opening corresponding to the location of the subsequently formed opening 131. The dielectric layer 129 and the cap layer 125 are etched using the patterned photoresist layer as an etch mask to form the opening 131 in the dielectric layer 129 and passing through the cap layer 125 to expose the top electrode 123.

Figure 14:
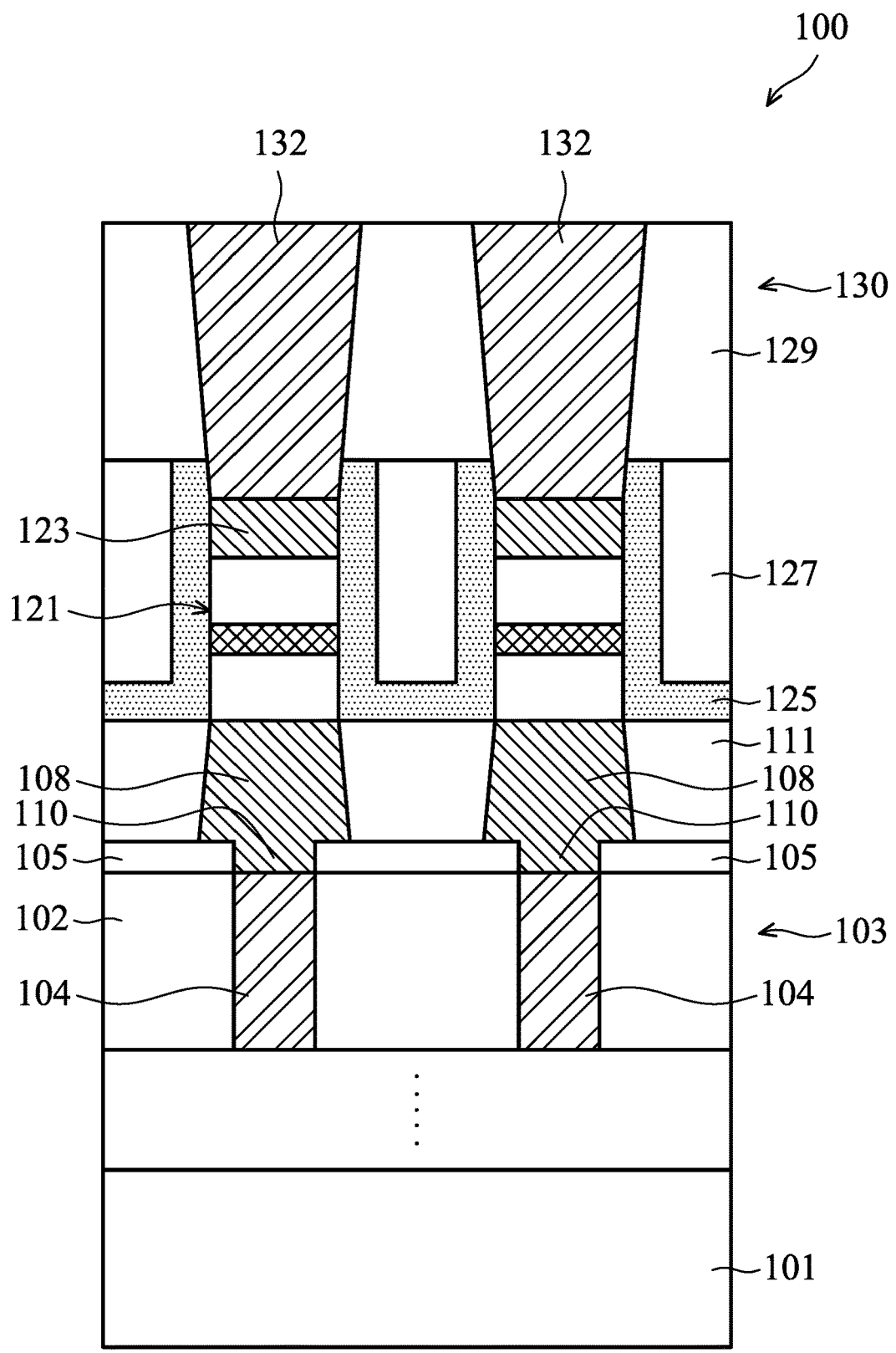

Next, a metal layer (not shown) is deposited on the dielectric layer 129 and to fill the opening 131. The material of the metal layer may include aluminum (Al), copper (Cu), gold (Au), tungsten (W), other suitable materials, or a combination thereof. The metal layer may be deposited by ALD, PECVD, PVD, or another deposition process. An excess portion of the metal layer over the dielectric layer 129 is then removed to form a metal line or via 132 in the dielectric layer 129 and passing through the cap layer 125 to be in contact with the top electrode 123, as shown in FIG. 14 in accordance with some embodiments. The excess portion of the metal layer may be removed by a planarization process, such as a CMP process. The metal line or via 132 is a conductive feature penetrating the cap layer 125 to contact the top electrode 123.

The metal line or via 132 in the dielectric layer 129 may be a lowest metal layer of an upper interconnect structure 130 that is disposed above the top electrodes 123. Although FIG. 14 shows the lowest layer of the upper interconnect structure 130, the upper interconnect structure 130 includes multiple IMD layers, metal layers and via features. The metal line or via 132 is electrically coupled to the top electrode 123 for providing or transferring electrical signal to the MTJ structure 121 through the top electrode 123. In addition, the metal line 104 in the upmost dielectric layer 102 of the lower interconnect structure 103 is electrically coupled to the bottom electrode 108 for providing or transferring electrical signal to the MTJ structure 121 through the bottom electrode 108. The metal line 104 of the lower interconnect structure 103 is electrically coupled to the bottom electrode 108 through the via 110 in the etch stop layer 105. The upper interconnect structure 130 and the lower interconnect structure 103 may be collectively referred to as a back-end-of-the-line (BEOL) interconnect structure. The MTJ structure 121 is formed within the BEOL interconnection structure and between two adjacent metal layers of the BEOL interconnection structure. Afterwards, the MRAM device 100 is fabricated.

Figure 15:
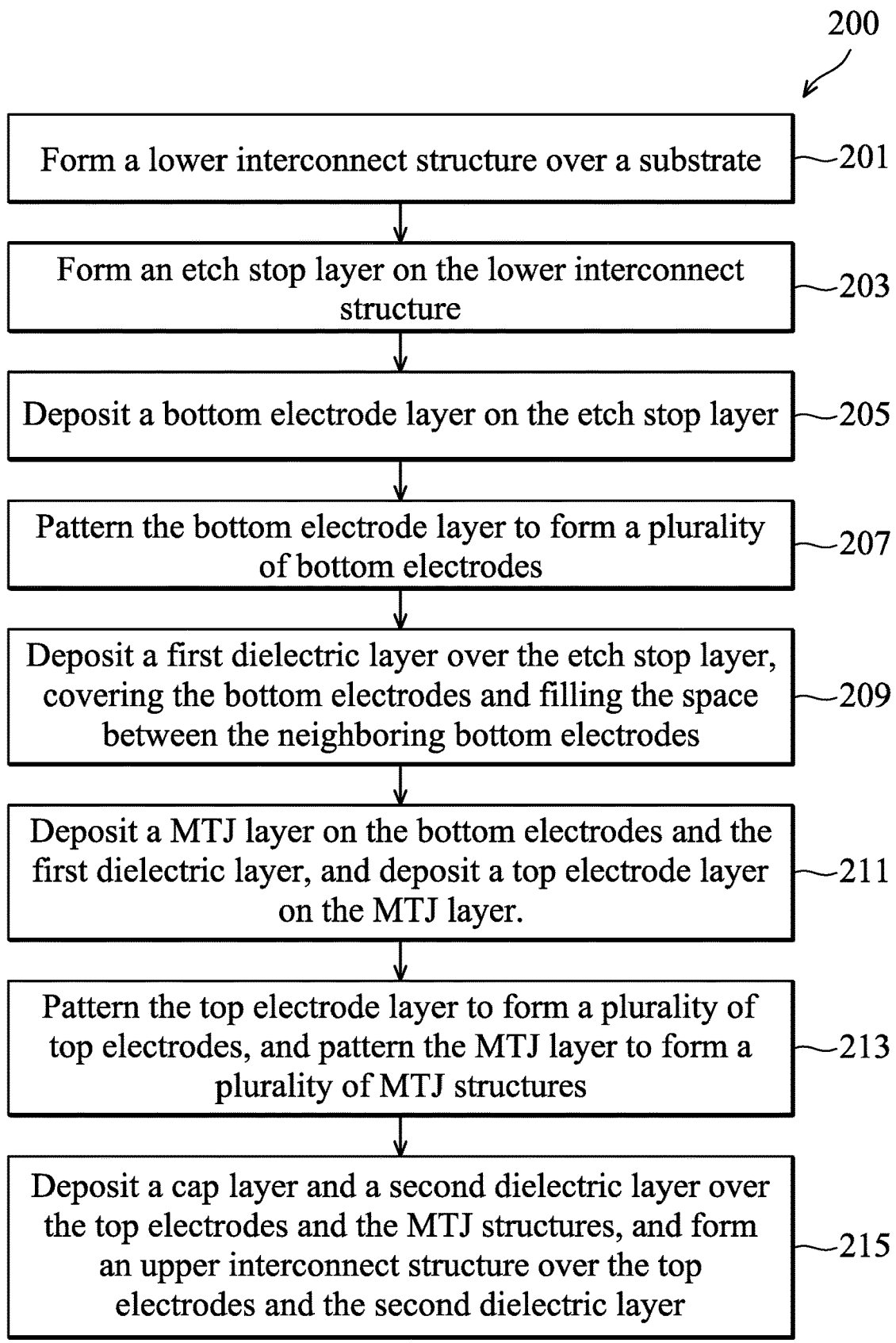
FIG. 15 is a flow chart of an exemplary method of fabricating a MRAM device, in accordance with some embodiments.

FIG. 15 is a flow chart of an exemplary method 200 of fabricating a MRAM device, in accordance with some embodiments. In block 201 of the method 200 and with reference to FIG. 1, a lower interconnect structure 103 is formed over a substrate 101. The lower interconnect structure 103 includes multiple IMD layer, metal layers, via features and contact features. The upmost metal layer includes multiple metal lines 104 disposed in the upmost IMD layer 102. In some embodiments, each of the metal lines 104 is electrically coupled to a bottom electrode of a respective MRAM cell. The MRAM device includes multiple MRAM cells which are arranged in an array. Moreover, each MRAM cell includes an MTJ structure sandwiched between a top electrode and a bottom electrode.

In block 203 of the method 200 and still with reference to FIG. 1, an etch stop layer (ESL) 105 is formed on the lower interconnect structure 103. The etch stop layer 105 can protect the lower interconnect structure 103 during etching a subsequently formed bottom electrode layer thereon to form a plurality of bottom electrodes. Moreover, the etch stop layer 105 has openings 106 to expose the metal lines 104 of the lower interconnect structure 103. The material and process for forming the etch stop layer 105 having the openings 106 may be the same as or similar to those described with respect to FIG. 1, and the details are not repeated herein. In some examples, the etch stop layer 105 has a thickness in a range from about 30 Å to about 200 Å.

In block 205 of the method 200 and with reference to FIG. 2, a bottom electrode layer 107 is deposited on the etch stop layer 105. Moreover, the bottom electrode layer 107 fills the openings 106 of the etch stop layer 105 to form vias 110. The vias 110 are in contact with and are electrically connected to the metal lines 104 of the lower interconnect structure 103. The material and process of forming of the bottom electrode layer 107 may be the same as or similar to those described with respect to FIG. 2, and the details are not repeated herein. In some examples, the bottom electrode layer 107 has a thickness in a range from about 10 Å to about 1000 Å.

In block 207 of the method 200 and with reference to FIGS. 3 and 4, the bottom electrode layer 107 is patterned by lithography and etching processes using the mask 109 of FIG. 3 as an etch mask to form a plurality of bottom electrodes (or referred to as bottom electrode vias) 108 of FIG. 4. The etching process may include an IBE or a RIE process. The details of the etching process may be the same as or similar to those described with respect to FIGS. 3 and 4, and the details are not repeated herein. As a result, the bottom electrode 108 has a bottom width that is substantially the same as or greater than a top width thereof. In some examples, the top width and the bottom width of the bottom electrode 108 are in a range from about 15 nm to about 300 nm. The angle θ between the sidewall and the bottom surface of the bottom electrode 108 is in a range from about 50 degrees to about 90 degrees.

In block 209 of the method 200 and with reference to FIGS. 5 and 6, a dielectric layer 111 is deposited over the etch stop layer 105, covering the bottom electrodes 108 and filling the space between the neighboring bottom electrodes 108. The materials and the processes for forming the dielectric layer 111 may be the same as or similar to those described with respect to FIGS. 5 and 6, and the details are not repeated herein. Next, a portion of the dielectric layer 111 is removed to expose the top surface of the bottom electrodes 108. The portion of the dielectric layer 111 may be removed by an etch-back process or a planarization process, such as a CMP process. After that, the top surfaces of the bottom electrodes 108 are level with the top surface of the dielectric layer 111.

In block 211 of the method 200 and with reference to FIG. 7, an MTJ layer 120 is deposited on the planar top surface of the bottom electrodes 108 and the dielectric layer 111. The MTJ layer 120 includes a first ferromagnetic layer 113 arranged over the bottom electrodes 108 and the dielectric layer 111, an insulating barrier layer 115 arranged over the first ferromagnetic layer 113, and a second ferromagnetic layer 117 arranged over the insulating barrier layer 115. In some embodiments, the first ferromagnetic layer 113 is a pinned layer, and the second ferromagnetic layer 117 is a free layer. In some other embodiments, the first ferromagnetic layer 113 is a free layer, and the second ferromagnetic layer 117 is a pinned layer. The MTJ layer 120 further includes an AFM layer disposed under the pinned layer. The materials and the processes for forming various layers of the MTJ layer 120 may be the same as or similar to those described with respect to FIG. 7, and the details are not repeated herein.

Still in block 211 of the method 200 and with reference to FIG. 7, a top electrode layer 122 is deposited on the MTJ layer 120. Also, the materials and the processes for forming the top electrode layer 122 may be the same as or similar to those described with respect to FIG. 7, and the details are not repeated herein. In some examples, the top electrode layer 122 has a thickness in a range from about 100 Å to about 600 Å.

In block 213 of the method 200 and with reference to FIGS. 8 and 9, the top electrode layer 122 is patterned to form a plurality of top electrodes 123, and the MTJ layer 120 is patterned to form a plurality of MTJ structures 121. The top electrode layer 122 and the MTJ layer 120 may be etched using the mask 124 of FIG. 8 as an etch mask in one step in the same etching process or in multiple steps in different etching processes. The etching process for the MTJ layer 120 and the top electrode layer 122 may include an IBE or a RIE process. The details of the IBE and RIE process may be the same as or similar to those described with respect to FIGS. 8 and 9, and are not repeated herein.

In block 215 of the method 200 and with reference to FIGS. 10 to 12, a cap layer 125 is conformally deposited on the top electrodes 123, the MTJ structures 121 and the dielectric layer 111. A dielectric layer 127 is deposited on the cap layer 125 and in contact with the cap layer 125, and further fills the remaining space between the neighboring pillars of the top electrodes 123 and the MTJ structures 121. After a planarization process, the dielectric layer 127 is coplanar with the cap layer 125.

Still in block 215 of the method 200 and with reference to FIGS. 13 and 14, an upper interconnect structure 130 is formed over the top electrodes 123 and the dielectric layer 127. The metal lines or vias 132 of the lowest metal layer of the upper interconnect structure 130 is electrically connected to the top electrodes 123. After that, the MRAM device is fabricated.

Figure 16:
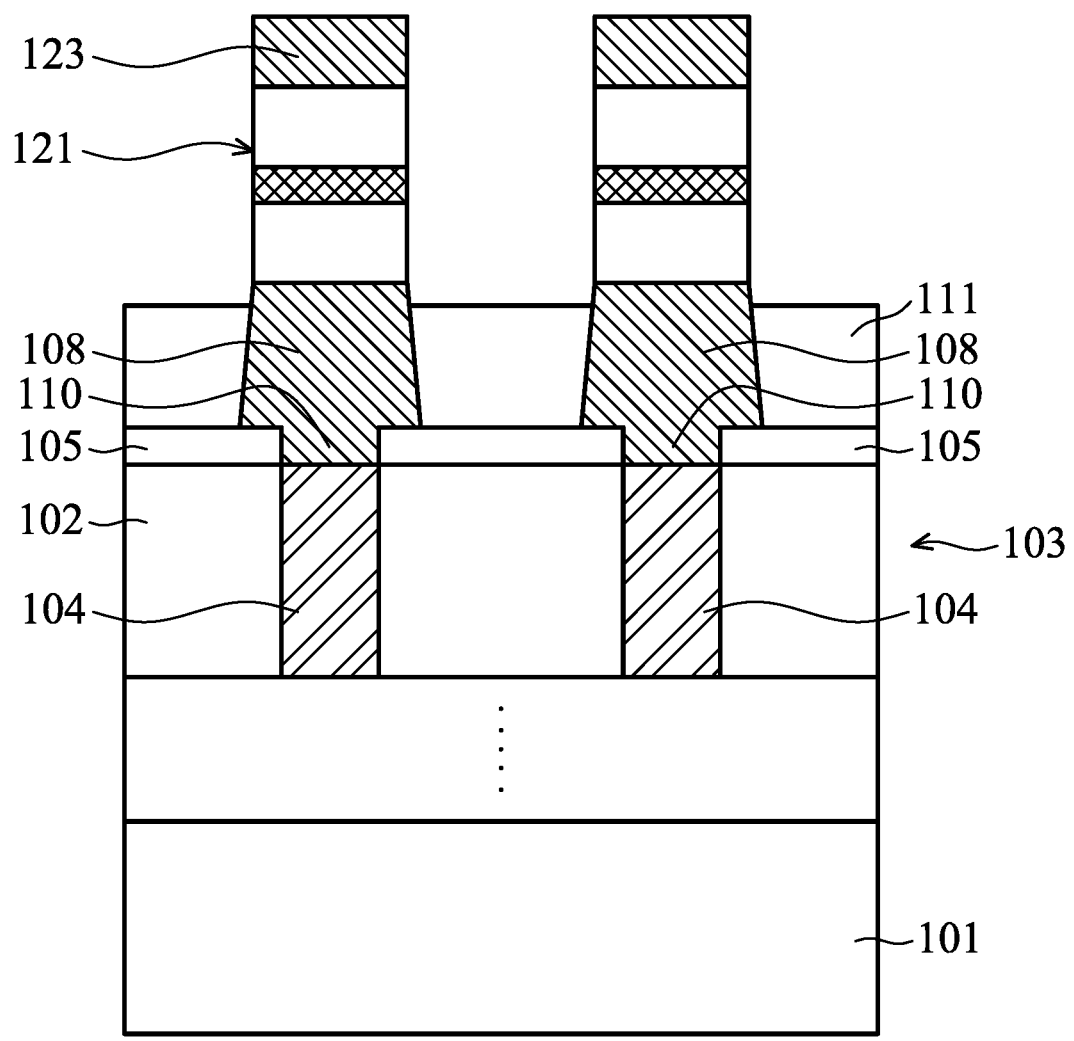
FIGS. 16 and 17 illustrate cross-sectional views of intermediate structures at several stages of fabricating a MRAM device, in accordance with some other embodiments.
Figure 17:
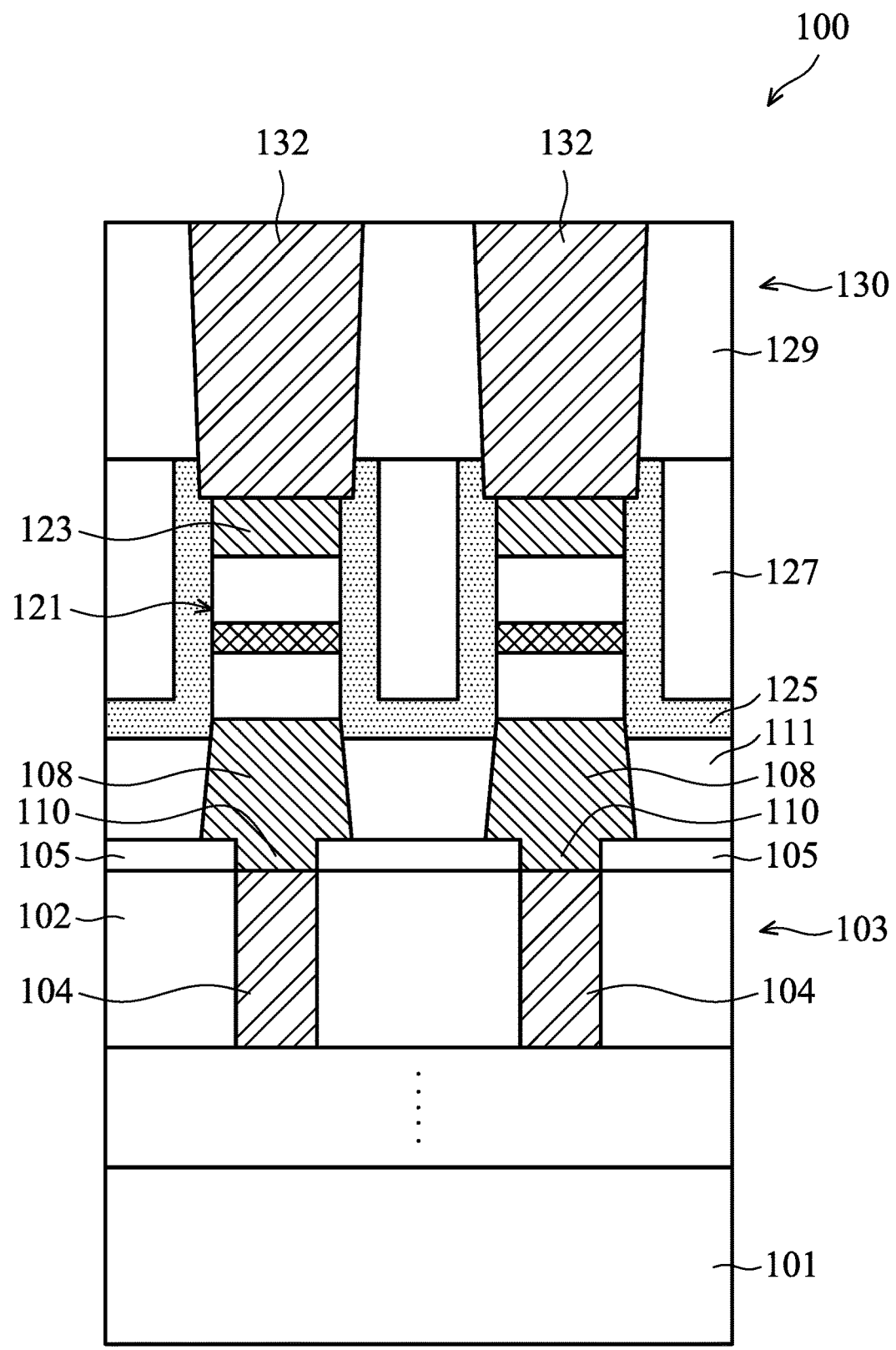

FIGS. 16 and 17 illustrate cross-sectional views of intermediate structures at several stages of fabricating a MRAM device 100, in accordance with some other embodiments. Following the structure of FIG. 8, the top electrode layer 122 is patterned by an etching process using the mask 124 of FIG. 8 as an etch mask to form a plurality of top electrodes 123, as shown in FIG. 16 in accordance with some embodiments. Also, the MTJ layer 120 is patterned by an etching process using the mask 124 of FIG. 8 as an etch mask to form a plurality of MTJ structures 121, as shown in FIG. 16 in accordance with some embodiments. Moreover, in the embodiment, the dielectric layer 111 is also slightly etched during etching the MTJ layer 120. The top surface of the etched dielectric layer 111 is lower than the top surface of the bottom electrode 108.

In some embodiments, the top electrode layer 122 and the MTJ layer 120 are patterned in one step of the same etching process. In some other embodiments, the top electrode layer 122 and the MTJ layer 120 are patterned in multiple steps of different etching processes. The etching process for the MTJ layer 120 and the top electrode layer 122 may include an IBE or a RIE process. The process conditions of the etching process for the MTJ layer 120 and the top electrode layer 122, except for a slightly longer etching time, may be the same as or similar to those described with respect to FIGS. 8 and 9, and are not repeated herein.

After that, the cap layer 125 and the dielectric layer 127 are deposited over the dielectric layer 111 to cover the top electrodes 123 and the MTJ structures 121, as shown in FIG. 17 in accordance with some embodiments. The bottom surface of the cap layer 125 is also lower than the top surface of the bottom electrode 108. In the embodiment, the cap layer 125 is extended over the interface between the bottom electrode 108 and the MTJ structure 121 to provide a better protection. In addition, an upper interconnect structure 130 is formed on the top electrodes 123 and the dielectric layer 127, as shown in FIG. 17 in accordance with some embodiments. A portion of the cap layer 125 is removed to create an opening to expose the top electrode 123. In the embodiment, the opening in the cap layer 125 is wider than the top electrode 123 and is also larger than the area of the top electrode 123. The conductive feature 132, such as a metal line or via of the upper interconnect structure 130 fills the opening in the cap layer 125. The large opening in the cap layer 125 can provide a large landing area for the conductive feature 132 of the upper interconnect structure 130 onto the top electrode 123. Therefore, the contact resistance between the conductive feature 132 and the top electrode 123 is reduced. Afterwards, the MRAM device 100 is fabricated.

According to some embodiments of the disclosure, firstly, a bottom electrode layer 107 is patterned using lithography and etching processes to form a plurality of bottom electrodes (or referred to as bottom electrode vias) 108, and then an MTJ layer 120 is patterned using other lithography and etching processes to form a plurality of MTJ structures 121. After the MTJ structure 121 is formed, there is no need to pattern a bottom electrode layer using lithography and etching processes. Therefore, there is no overlay shift issue to damage the formed MTJ structure 121. The bottom electrode 108 is formed first, such that the subsequently formed MTJ structure 121 without punch through issue can be achieved. Since the bottom electrode 108 of MRAM cell is formed without MTJ structure damage issue, it is advantageous to development of a small pitch between MRAM cells in a MRAM device. Moreover, the electrical characteristic, reliability and performance of the MRAM devices are also improved.

In addition, according to some embodiments of the disclosure, the MTJ structure 121 is formed without punch through issue since the bottom electrode 108 is formed first. Therefore, there is no need to form additional spacers over a cap layer 125 along the sidewalls of the MTJ structure 121. The additional spacers are used to enlarge the process window of a lithography process for patterning a bottom electrode layer after the MTJ structure is formed in other examples. In some embodiments of the disclosure, the process steps of forming a spacer along the sidewalls of the MTJ structure can be omitted.

Moreover, according to some embodiments of the disclosure, the bottom electrode layer 107 is patterned using lithography and etching processes to form the bottom electrodes 108 before depositing the MTJ layer 120 and the top electrode layer 122 thereon. Therefore, the bottom electrode layer 107 with a thick thickness is easily etched. The bottom electrode 108 formed of the thick bottom electrode layer 107 may have a better conductivity. In addition, while etching the top electrode layer 122 and the MTJ layer 120 to form the top electrode 123 stacked on the MTJ structure 121, the bottom electrode 108 is surrounded and protected by the dielectric layer 111. Therefore, the embodiments of the disclosure can avoid damaging the bottom electrode 108 during the etching process for the top electrode layer 122 and the MTJ layer 120. Therefore, the reliability and the product yield rate of the MRAM devices of the disclosure are enhanced.

In some embodiments, a method of fabricating a MRAM device is provided. The method includes forming an etch stop layer over a substrate, and depositing a bottom electrode layer on the etch stop layer. The method also includes patterning the bottom electrode layer to form a bottom electrode. The method further includes depositing a magnetic tunnel junction (MTJ) layer on the bottom electrode, and depositing a top electrode layer on the MTJ layer. In addition, the method includes patterning the top electrode layer to form a top electrode, and patterning the MTJ layer to form an MTJ structure.

In some embodiments, a method of fabricating a MRAM device is provided. The method includes forming an etch stop layer over a substrate, and depositing a bottom electrode layer on the etch stop layer. The method also includes patterning the bottom electrode layer to form a plurality of bottom electrodes, and forming a first dielectric layer on the etch stop layer and filling a space between the neighboring bottom electrodes. The method further includes depositing a magnetic tunnel junction (MTJ) layer on the bottom electrodes and the first dielectric layer, and depositing a top electrode layer on the MTJ layer. In addition, the method includes patterning the top electrode layer to form a plurality of top electrodes, and patterning the MTJ layer to form a plurality of MTJ structures.

In some embodiments, a MRAM device is provided. The MRAM device includes a bottom electrode over a substrate. The MRAM device also includes a magnetic tunnel junction (MTJ) structure on the bottom electrode. The MRAM device further includes a top electrode on the MTJ structure. The bottom electrode has a slanted sidewall, and an upper portion of the slanted sidewall of the bottom electrode is vertically aligned with a sidewall of the MTJ structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a magnetic random access memory (MRAM) device, comprising:
    forming an etch stop layer over a substrate;
    depositing a bottom electrode layer on the etch stop layer;
    patterning the bottom electrode layer to form a bottom electrode;
    forming a first dielectric layer on the etch stop layer and around the bottom electrode, wherein the bottom electrode has an upper slanted sidewall surrounded by the first dielectric layer and a lower vertical sidewall surrounded by the etch stop layer;
    depositing a magnetic tunnel junction (MTJ) layer on the bottom electrode, wherein a topmost surface of the etch stop layer is in direct contact with the bottom electrode and separated from the MTJ layer;
    depositing a top electrode layer on the MTJ layer;
    patterning the top electrode layer to form a top electrode; and
    patterning the MTJ layer to form an MTJ structure.

2. The method as claimed in claim 1, wherein the bottom electrode layer is patterned to form the bottom electrode before patterning the top electrode layer and the MTJ layer.

3. The method as claimed in claim 1, wherein forming the first dielectric layer comprises:
depositing a first dielectric layer over the etch stop layer and covering the bottom electrode; and
removing a portion of the first dielectric layer to expose the bottom electrode.

4. The method as claimed in claim 3, wherein the MTJ layer is deposited on the first dielectric layer after the portion of the first dielectric layer is removed.

5. The method as claimed in claim 3, wherein the bottom electrode is surrounded by the first dielectric layer while patterning the top electrode layer and the MTJ layer.

6. The method as claimed in claim 3, further comprising:
forming a cap layer conformally on the top electrode, the MTJ structure and the first dielectric layer; and
depositing a second dielectric layer on the cap layer and in contact with the cap layer.

7. The method as claimed in claim 6, further comprising:
removing a portion of the second dielectric layer to expose the cap layer; and
removing a portion of the cap layer to expose the top electrode.

8. The method as claimed in claim 1, wherein patterning the bottom electrode layer includes forming a mask on a top surface of the bottom electrode layer, and etching the bottom electrode layer by a dry etching process using the mask as an etch mask to form the bottom electrode with the slanted sidewall.

9. The method as claimed in claim 1, further comprising:
forming a cap layer conformally on the top electrode, the MTJ structure and the first dielectric layer; and
depositing a second dielectric layer on the cap layer and in contact with the cap layer, wherein an interface between the second dielectric layer and the cap layer is U-shaped.

10. The method as claimed in claim 1, further comprising:
forming a lower interconnect structure under the etch stop layer and electrically connected to the bottom electrode, wherein a sidewall of a metal line of the lower interconnect structure is substantially aligned with the lower vertical sidewall of the bottom electrode.

11. A method of fabricating a magnetic random access memory (MRAM) device, comprising:
forming an etch stop layer over a substrate;
depositing a bottom electrode layer on the etch stop layer;
patterning the bottom electrode layer to form a plurality of bottom electrodes;
forming a first dielectric layer on the etch stop layer and filling a space between the neighboring bottom electrodes, wherein each of the bottom electrodes has a first width at a top surface of the first dielectric layer, a second width at a bottom surface of the first dielectric layer, and a third width at a bottom surface of the etch stop layer, and wherein the first width is less than the second width and greater than the third width;
depositing a magnetic tunnel junction (MTJ) layer on the bottom electrodes and the first dielectric layer;
depositing a top electrode layer on the MTJ layer;
patterning the top electrode layer to form a plurality of top electrodes;
patterning the MTJ layer to form a plurality of MTJ structures;
forming a cap layer conformally on the top electrodes, the MTJ structures and the first dielectric layer; and
depositing a second dielectric layer on the cap layer, wherein opposite sidewalls and a bottom surface of the second dielectric layer are surrounded by the cap layer.

12. The method as claimed in claim 11, wherein a top surface of the first dielectric layer is lower than top surfaces of the bottom electrodes after patterning the MTJ layer.

13. The method as claimed in claim 11, further comprising:
removing a portion of the second dielectric layer and a portion of the cap layer to expose the top electrodes;
forming an upper interconnect structure over the top electrodes and electrically coupled to the top electrodes; and
forming a lower interconnect structure under the bottom electrodes and electrically coupled to the bottom electrodes.

14. The method as claimed in claim 13, wherein removing the portion of the cap layer creates an opening that is wider than the top electrode, and a conductive feature of the upper interconnect structure fills the opening.

15. The method as claimed in claim 11, wherein the second width is a greatest width of each of the bottom electrodes.

16. A method of fabricating a magnetic random access memory (MRAM) device, comprising:
depositing a bottom electrode layer over a substrate;
patterning the bottom electrode layer to form a bottom electrode;
forming a first dielectric layer over the substrate and surrounding the bottom electrode;
depositing a magnetic tunnel junction (MTJ) layer on the bottom electrode and the first dielectric layer;
depositing a top electrode layer on the MTJ layer;
patterning the top electrode layer to form a top electrode;
patterning the MTJ layer to form an MTJ structure, wherein the first dielectric layer is etched below a top surface of the bottom electrode during patterning the MTJ layer, and a top surface of the first dielectric layer is horizontal to the top surface of the bottom electrode after patterning the MTJ layer; and
forming a cap layer conformally on the top electrode, the MTJ structure and the first dielectric layer, wherein a bottom surface of the cap layer is lower than a top surface of the bottom electrode.

17. The method as claimed in claim 16, wherein the bottom electrode has a slanted sidewall, and an upper portion of the slanted sidewall of the bottom electrode is substantially aligned with a sidewall of the MTJ structure.

18. The method as claimed in claim 16, wherein a sidewall of the top electrode is substantially aligned with a sidewall of the MTJ structure, and a width of the MTJ structure is greater than a top width of the bottom electrode.

19. The method as claimed in claim 16, wherein the bottom electrode layer is patterned to form the bottom electrode before forming the first dielectric layer.

20. The method as claimed in claim 19, further comprising:
depositing a second dielectric layer on the cap layer and in contact with the cap layer;
removing a portion of the second dielectric layer to expose the cap layer; and
removing a portion of the cap layer to expose the top electrode, wherein the top surface of the bottom electrode is lower than a top surface of the cap layer after removing the portion of the cap layer.

* * * * *